(12) United States Patent
Feng et al.

(10) Patent No.: US 8,981,235 B2
(45) Date of Patent: Mar. 17, 2015

(54) ELECTRONIC ELEMENT

(71) Applicant: Beijing FUNATE Innovation Technology Co., Ltd., Beijing (CN)

(72) Inventors: Chen Feng, Beijing (CN); Li Qian, Beijing (CN); Yu-Quan Wang, Beijing (CN)

(73) Assignee: Beijing FUNATE Innovation Technology Co., Ltd., Beijing (CN)

( * ) Notice: Subject to any disclaimer, the term of this patent is extended or adjusted under 35 U.S.C. 154(b) by 16 days.

(21) Appl. No.: 13/786,630

(22) Filed: Mar. 6, 2013

(65) Prior Publication Data

US 2013/0284503 A1 Oct. 31, 2013

(30) Foreign Application Priority Data

Apr. 25, 2012 (CN) .......................... 2012 1 0122623

(51) Int. Cl.
*H01B 1/04* (2006.01)
*B82B 1/00* (2006.01)
*H05K 1/09* (2006.01)
*B82Y 30/00* (2011.01)
(52) U.S. Cl.
CPC .. *H05K 1/09* (2013.01); *H01B 1/04* (2013.01); *B82Y 30/00* (2013.01); *Y10S 977/742* (2013.01)
USPC .......................................... 174/257; 977/742
(58) Field of Classification Search
CPC ............. H05K 1/09; H01B 1/04; B82Y 30/00
USPC .......................................... 174/257; 977/762
See application file for complete search history.

(56) References Cited

U.S. PATENT DOCUMENTS

| 6,720,728 | B2* | 4/2004 | Den et al. ...................... 313/495 |
| 6,863,942 | B2* | 3/2005 | Ren et al. ..................... 428/36.9 |
| 7,148,619 | B2* | 12/2006 | Den et al. ...................... 313/495 |
| 8,115,187 | B2* | 2/2012 | Segal et al. ........................ 257/4 |
| 2006/0276056 | A1* | 12/2006 | Ward et al. .................... 438/800 |
| 2008/0248235 | A1* | 10/2008 | Feng et al. ..................... 428/113 |
| 2009/0167708 | A1 | 7/2009 | Jiang et al. |
| 2009/0167710 | A1 | 7/2009 | Jiang et al. |

(Continued)

FOREIGN PATENT DOCUMENTS

| CN | 101790490 | 7/2010 |
| CN | 102086035 | 6/2011 |

(Continued)

*Primary Examiner* — Timothy Thompson
*Assistant Examiner* — Guillermo Egoavil
(74) *Attorney, Agent, or Firm* — Novak Druce Connolly Bove + Quigg LLP

(57) ABSTRACT

An electronic element includes a carbon nanotube film, at least one first electrode and at least one second electrode spaced from the at least one first electrode. The carbon nanotube film includes a number of carbon nanotube linear units spaced from each other, and a number of carbon nanotube groups. The carbon nanotube linear units extend along a first direction to form a number of first conductive paths. The carbon nanotube groups are combined with the carbon nanotube linear units by van der Waals force in a second direction intercrossed with the first direction, to form a number of second conductive paths. The carbon nanotube groups between adjacent carbon nanotube linear units are spaced from each other in the first direction. The at least one first and second electrodes are electrically connected with the carbon nanotube film through the first conductive paths or the second conductive paths.

18 Claims, 7 Drawing Sheets

(56) References Cited

U.S. PATENT DOCUMENTS

| | | |
|---|---|---|
| 2009/0311489 A1 | 12/2009 | Sheehan et al. |
| 2010/0059736 A1* | 3/2010 | Tombler, Jr. .................. 257/14 |
| 2010/0124645 A1* | 5/2010 | Jiang et al. .................. 428/220 |
| 2010/0124646 A1 | 5/2010 | Jiang et al. |
| 2011/0036828 A1 | 2/2011 | Feng et al. |
| 2011/0095237 A1 | 4/2011 | Liu et al. |
| 2011/0117316 A1* | 5/2011 | Lemaire .................. 428/113 |
| 2011/0134058 A1* | 6/2011 | Liu et al. .................. 345/173 |
| 2011/0135894 A1* | 6/2011 | Liu et al. .................. 428/206 |
| 2011/0157038 A1* | 6/2011 | Feng .................. 345/173 |
| 2011/0171419 A1* | 7/2011 | Li et al. .................. 428/113 |
| 2011/0253907 A1 | 10/2011 | Qian et al. |
| 2013/0287998 A1* | 10/2013 | Feng et al. .................. 428/138 |
| 2014/0069699 A1* | 3/2014 | Feng et al. .................. 174/257 |

FOREIGN PATENT DOCUMENTS

| | | |
|---|---|---|
| TW | 200928912 | 7/2009 |
| TW | 201020208 | 6/2010 |
| TW | 201107548 | 3/2011 |
| TW | 201121877 | 7/2011 |
| TW | 201137919 | 11/2011 |

\* cited by examiner

ELECTRONIC ELEMENT

RELATED APPLICATIONS

This application claims all benefits accruing under 35 U.S.C. §119 from China Patent Application No. 201210122623.7, filed on Apr. 25, 2012 in the China Intellectual Property Office, the disclosure of which is incorporated herein by reference.

BACKGROUND

1. Technical Field

The present disclosure relates to electronic elements, and particularly to an electronic element based on carbon nanotubes.

2. Discussion of Related Art

Electronic elements, especially thin film electronic elements, are important elements in various electronic devices, such as touch panels, liquid crystal display devices, or field emission display devices.

Conventional thin film electronic elements usually includes electrically conductive layers, which mainly consist of metal or metal oxide, such as silver (Ag), copper (Cu), gold (Au), indium-tin oxide (ITO), or zinc oxide (ZnO). The conductive layers are difficult to fold, and the mechanical and chemical properties are not ideal. As such, the life spans of the electronic elements are affected. The conventional conductive layers in the electronic elements are mainly formed by applying electrically conductive materials on a substrate using deposition methods, evaporation methods, or sputtering methods. These methods need a process of high-temperature annealing, which will damage the substrate on which the electronic element is formed. Thus, the life spans of the electronic elements are short.

What is needed, therefore, is to provide an electronic element with a long life span to overcome the above shortages.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
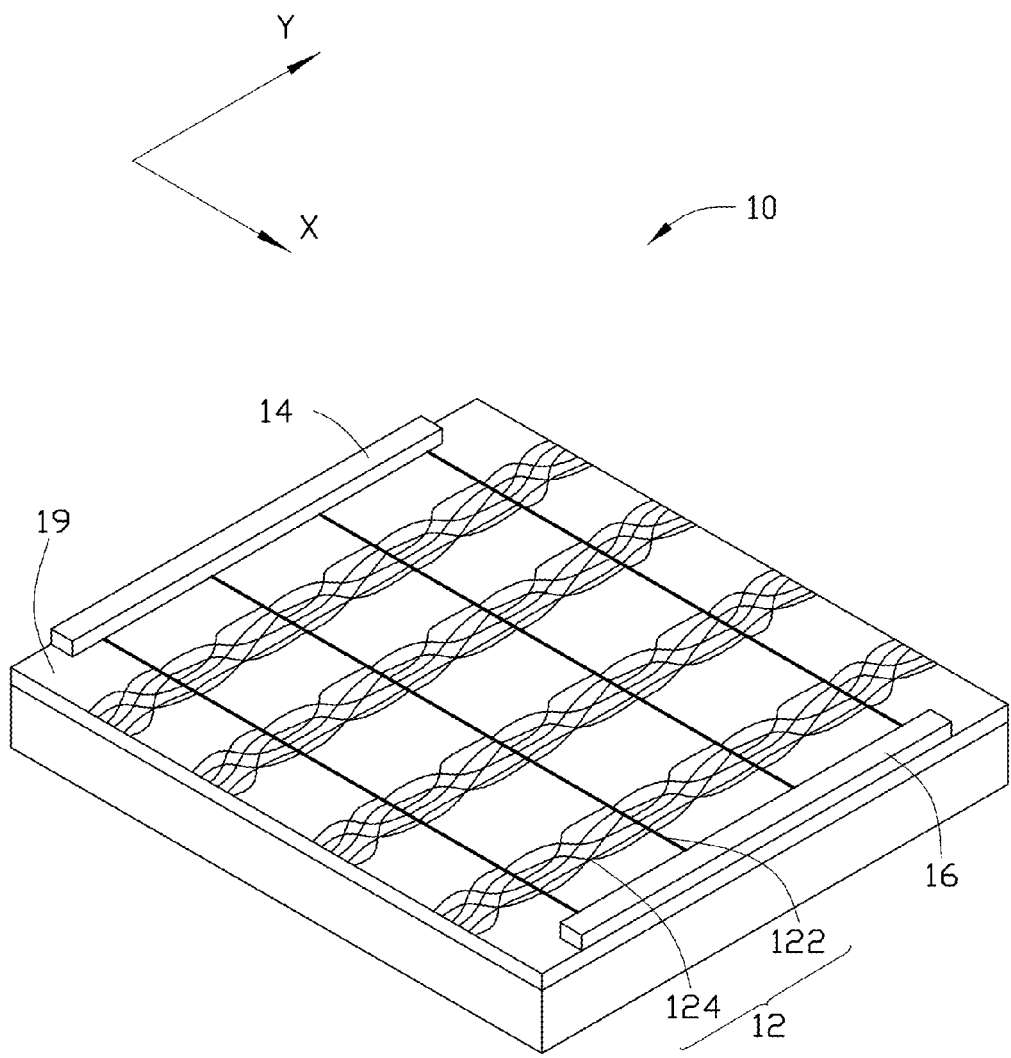
FIG. 1 is a schematic view of one embodiment of an electronic element including a carbon nanotube film.
Figure 2:
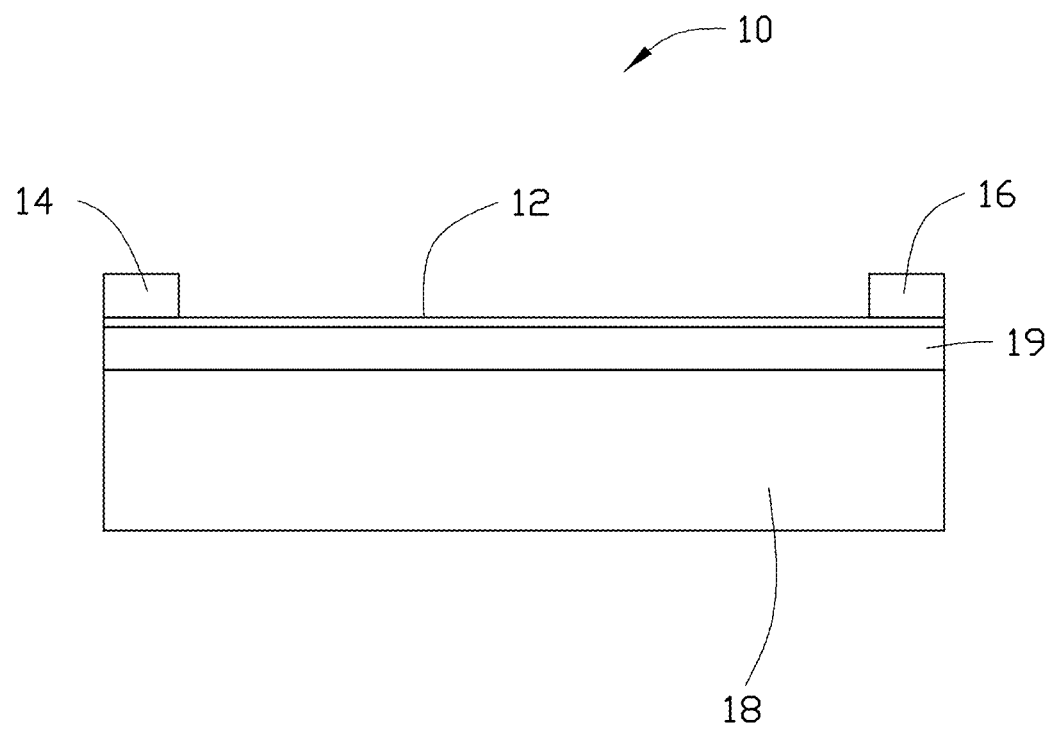
FIG. 2 is a sectional view of the electronic element shown in FIG. 1 along a broken line II-II.
Figure 3:
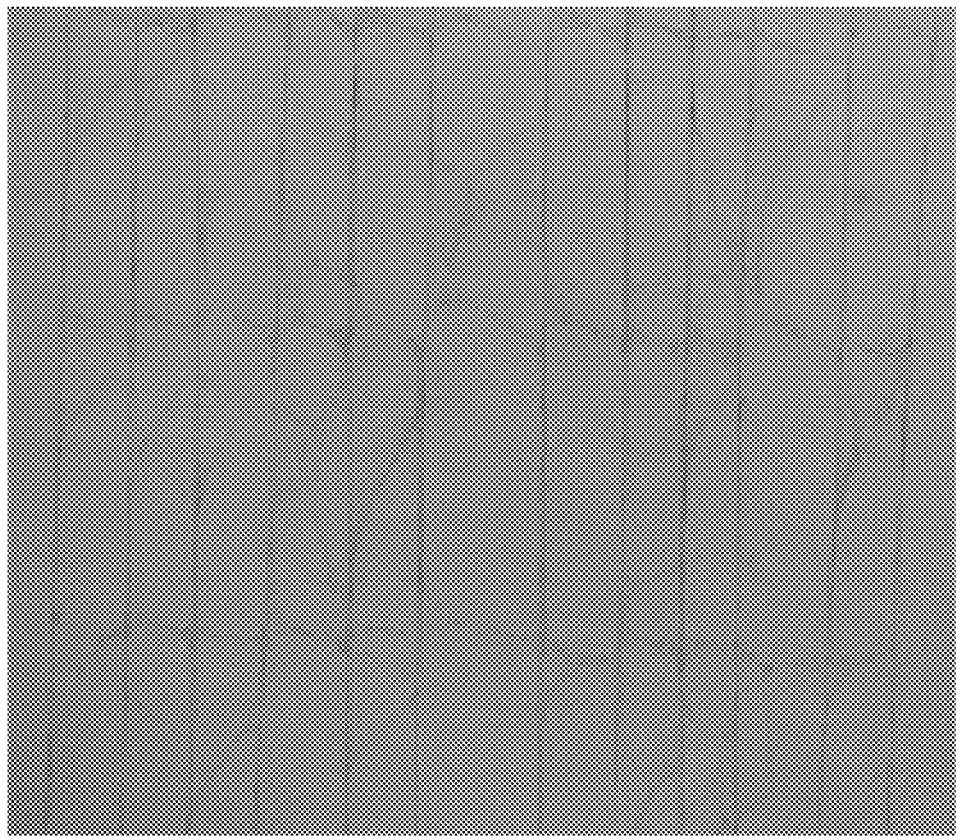
FIG. 3 is an optical microscope image of the carbon nanotube film shown in FIG. 1.
Figure 4:
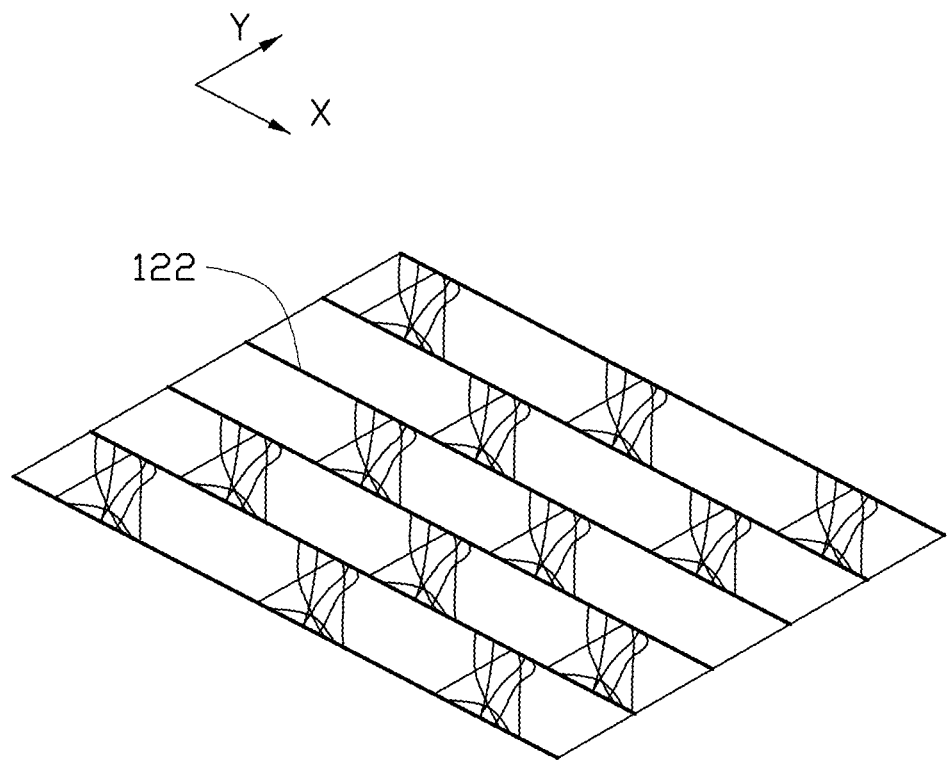
FIG. 4 is a schematic view of one embodiment of a carbon nanotube film including a number of carbon nanotube groups interlacedly arranged.

Referring to FIG. 1 and FIG. 2, one embodiment of an electronic element 100 includes a carbon nanotube film 12, a first electrode 14 and a second electrode 16 spaced from the first electrode 14. The first electrode 14 and the second electrode 16 are electrically connected with the carbon nanotube film 12.

The carbon nanotube film 12 includes a number of carbon nanotube linear units 122 and a number of carbon nanotube groups 124. The carbon nanotube linear units 122 are spaced from each other. The carbon nanotube groups 124 join with the carbon nanotube linear units 122 by van der Waals force. The carbon nanotube groups 124 located between adjacent carbon nanotube linear units 122 are separated from each other.

Each carbon nanotube linear unit 122 includes a number of first carbon nanotubes extending substantially along a first direction X. Adjacent first carbon nanotubes extending substantially along the first direction X are joined end to end by van der Waals attractive force. In one embodiment, an axis of each carbon nanotube linear unit 122 is substantially parallel to the axes of first carbon nanotubes in each carbon nanotube linear unit 122. The carbon nanotube linear units 122 extend substantially along the first direction X, and are separated from each other in a second direction Y intercrossed with the first direction X.

An intersection shape of each carbon nanotube linear unit 122 can be a semi-circle, circle, ellipse, oblate spheriod, or other shapes. In one embodiment, the carbon nanotube linear units 122 are substantially parallel to each other. Distances between adjacent carbon nanotube linear units 122 are substantially equal. The carbon nanotube linear units 122 are substantially coplanar. An effective diameter of each carbon nanotube linear unit 122 is larger than or equal to 0.1 micrometers, and less than or equal to 100 micrometers. In one embodiment, the effective diameter of each carbon nanotube linear unit 122 is larger than or equal to 5 micrometers, and less than or equal to 50 micrometers. A distance between adjacent two carbon nanotube linear units 122 is not limited and can be selected as desired. In one embodiment, the distance between adjacent two carbon nanotube linear units 122 is greater than 0.1 millimeters. Diameters of the carbon nanotube linear units 122 can be selected as desired. In one embodiment, the diameters of the carbon nanotube linear units 122 are substantially equal.

The carbon nanotube groups 124 are separated from each other and combined with adjacent carbon nanotube linear units 122 by van der Waals force in the second direction Y, so that the carbon nanotube film 12 is a free-standing structure. "Free-standing structure" means that the carbon nanotube film does not have to be supported by a substrate and can sustain the weight of itself when it is hoisted by a portion thereof without tearing. The carbon nanotube groups 124 are alternated with the carbon nanotube linear units 122 on the second direction Y. In one embodiment, the carbon nanotube groups 124 arranged in the second direction Y are separated from each other by the carbon nanotube linear units 122. The carbon nanotube groups 124 arranged in the second direction Y can connect with the carbon nanotube linear units 122.

The carbon nanotube group 124 includes a number of second carbon nanotubes joined by van der Waals force. Axes of the second carbon nanotubes can be substantially parallel to the first direction X or the carbon nanotube linear units 122. The axes of the second carbon nanotubes can also be intercrossed with the first direction X or the carbon nanotube linear units 122 such that the second carbon nanotubes in each carbon nanotube group 124 are intercrossed into a network structure.

The axes of second carbon nanotubes and the first direction X define first angles. Each first angle can be greater than or equal to 0 degrees, and less than or equal to 90 degrees. In one embodiment, the first angle is greater than or equal to 45 degrees, and less than or equal to 90 degrees. In another embodiment, the first angle is greater than or equal to 60 degrees, and less than or equal to 90 degrees.

In one embodiment, the carbon nanotube groups 124 can be interlacedly located in the second direction Y and disorderly arranged in the second direction Y. As such, the carbon nanotube groups 124 in the second direction Y form non-linear conductive paths. In one embodiment, the carbon nanotube groups 124 are arranged into a number of columns in the second direction Y, thus the carbon nanotube groups 124 form consecutive and linear conductive paths in the second direction. In one embodiment, the carbon nanotube groups 124 in the carbon nanotube film are arranged in an array. A length of each carbon nanotube group 124 in the second direction Y is substantially equal to the distance between adjacent carbon nanotube linear units 122. The length of each carbon nanotube group 124 in the second direction Y is greater than 0.1 millimeters. The carbon nanotube groups 124 are also spaced from each other along the first direction X. Spaces between adjacent carbon nanotube groups 124 in the first direction X are greater than or equal to 1 millimeter.

Therefore, the carbon nanotube film includes a number of carbon nanotubes. The carbon nanotubes can be formed into carbon nanotube linear units 122 and carbon nanotube groups 124. In one embodiment, the carbon nanotube film consists of the carbon nanotubes. The carbon nanotube film defines a number of apertures. Specifically, the apertures are mainly defined by the separate carbon nanotube linear units 122 and the spaced carbon nanotube groups 124. The arrangement of the apertures is similar to the arrangement of the carbon nanotube groups 124. In the carbon nanotube film, if the carbon nanotube linear units 122 and the carbon nanotube groups 124 are orderly arranged, the apertures are also orderly arranged. In one embodiment, the carbon nanotube linear units 122 and the carbon nanotube groups 124 are substantially arranged in an array, and the apertures are also arranged in an array.

A ratio between a sum area of the carbon nanotube linear units 122 and the carbon nanotube groups 124 and an area of the apertures is less than or equal to 1:19. In other words, in the carbon nanotube film 12, a ratio of the area of the carbon nanotubes to the area of the apertures is less than or equal to 1:19. In one embodiment, in the carbon nanotube film 12, the ratio of the sum area of the carbon nanotube linear units 122 and the carbon nanotube groups 124 to the area of the apertures is less than or equal to 1:49. Therefore, a transparence of the carbon nanotube film 12 is greater than or equal to 95%. In one embodiment, the transparence of the carbon nanotube film 12 is greater than or equal to 98%.

The carbon nanotube film 12 is an anisotropic conductive film. The carbon nanotube linear units 122 form first conductive paths along the first direction, as the carbon nanotube linear units 122 extend substantially along the first direction X. The carbon nanotube groups 124 combined with the carbon nanotube linear units on the second direction form second conductive paths along the second direction Y. The second conductive paths can be curved second conductive paths, as the carbon nanotube groups are interlacedly arranged. The second conductive paths can be linear second conductive paths, as the carbon nanotube groups are arranged as a number of columns and rows. Therefore, a resistance of the carbon nanotube film 12 in the first direction X is different from a resistance of the carbon nanotube film 12 in the second direction Y. The resistance of the carbon nanotube film 12 in the second direction Y is 10 times greater than the resistance of the carbon nanotube film 12 in the first direction X. In one embodiment, the resistance of the carbon nanotube film 12 in the second direction Y is 20 times greater than the resistance of the carbon nanotube film 12 in the first direction X. In one embodiment, the resistance of the carbon nanotube film 12 in the second direction Y is about 50 times greater than the resistance of the carbon nanotube film 12 in the first direction X. In the carbon nanotube film 12, the carbon nanotube linear units 122 are joined by the carbon nanotube groups 124 in the second direction Y, which makes the carbon nanotube film 12 strong and stable, and not broken easily.

There can be a few carbon nanotubes surrounding the carbon nanotube linear units and the carbon nanotube groups in the carbon nanotube film. However, these few carbon nanotubes have a small and negligible effect on the carbon nanotube film properties.

The first electrode 14 and the second electrode 16 are located at two opposite ends of the carbon nanotube film 12. The first electrode 14 and the second electrode 16 are electrically connected with at least one conductive path of the first conductive paths and the second conductive paths. In one embodiment, the first electrode 14 and the second electrode 16 are separately located along the second direction Y on the carbon nanotube film 12, and electrically connected with the first conductive paths. In another embodiment, the first electrode 14 and the second electrode 16 are separately located along the first direction X on the carbon nanotube film 12, and electrically connected with the second conductive paths.

The first electrode 14 and the second electrode 16 consist of electrically conductive materials. Materials of the first electrode 14 and the second electrode 16 can be metal materials, electrically conductive polymer materials or carbon nanotubes. The metal materials can be gold, silver, or copper. The electrically conductive polymer materials can be polyacetylene, polyparaphenylene, polyaniline, polypyrrole, or polythiophene. In one embodiment, both the first electrode 14 and the second electrode 16 consist of silver paste.

The electronic element 10 can further include a substrate 18 supporting the carbon nanotube film 12. The substrate 18 can be a curved structure or a sheet-shaped structure. The substrate 18 can be transparent. In one embodiment, a transparence of the substrate 18 is greater than 75%. The substrate 18 can be made of a hard material or a flexible material. The material of the substrate 18 can be glass, quartz, diamond, or plastics. More specifically, the flexible material of the substrate 18 can be a polycarbonate (PC), polyethylene (PE), polypropylene (PP), polymethyl methacrylate (PMMA), polyethylene terephthalate (PET), polyether sulfone (PES), polyimide (PI), polyvinyl chloride (PVC), benzocyclobutene (BCB), cellulose ester, polyester, acrylic resin or any combination thereof. The material of the substrate 18 is not limited to the above mentioned materials. In one embodiment, the substrate 18 is a PET film with relatively good transparency.

The electronic element 10 also can include an adhesive layer 19 located between the substrate 18 and the carbon nanotube film 12, to fix the carbon nanotube film 12 on the substrate 18. Part of the adhesive layer 19 is exposed from the carbon nanotube film 12 through the apertures. The adhesive layer 19 can be made from thermoplastic adhesive, thermoset resin, or UV adhesive. A thickness of the adhesive layer 19 can be from about 1 nanometer to about 500 micrometers. In one embodiment, the thickness of the adhesive layer 19 is from about 1 micrometer to about 2 micrometers. The adhesive layer 19 can be transparent, and the transparency is greater than or equal to 75%. In one embodiment, the adhesive layer 19 is the UV adhesive layer with the thickness of about 1.5 micrometers.

The carbon nanotubes in the carbon nanotube film 12 of the electronic element 10 are excellent in mechanical properties and chemical endurance. The carbon nanotube film 12 also has mechanical properties and chemical endurance. In addition, the carbon nanotube linear units 122 are fixed through the carbon nanotube groups 124 to form the carbon nanotube film 12, which makes the carbon nanotube film 12 strong and stable, and not broken easily. Thus, a life span of the electronic element 10 using the carbon nanotube film 12 is improved. If the electronic element 10 is in use, a voltage is applied to the first electrode 14 and the second electrode 16, the first conductive paths or the second conductive paths in the carbon nanotube film 12 will be led, which can detect or sense electrical signals. The carbon nanotube film 12 is a transparent film. If the substrate 18 and the adhesive layer 19 are transparent, the electronic element 10 is also transparent and can be used in various electronic devices. The carbon nanotube film 12 is also flexible. If the substrate 18 is transparent and flexible, such as PET and PC, the electronic element 10 is also flexible and transparent.

Figure 5:
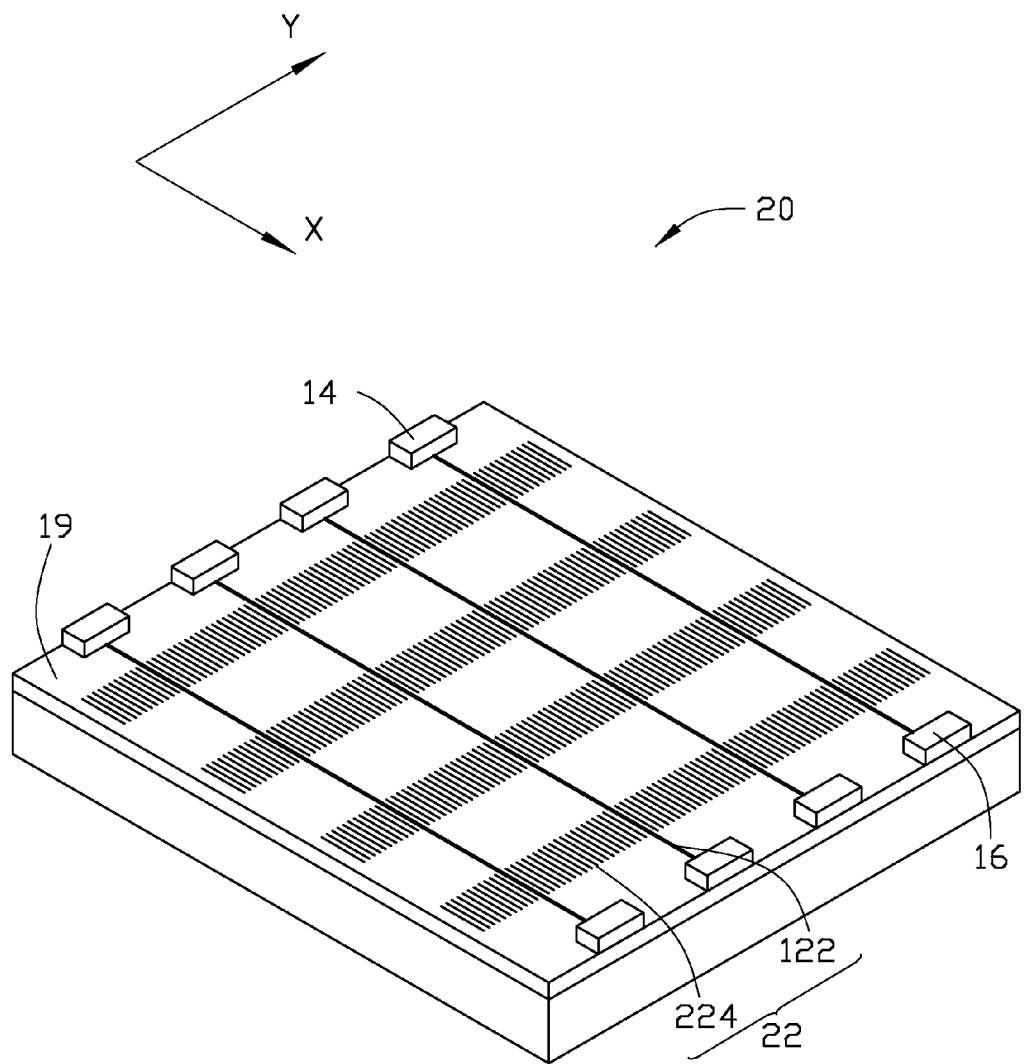
FIG. 5 is a schematic view of one embodiment of an electronic element including a carbon nanotube film.
Figure 6:
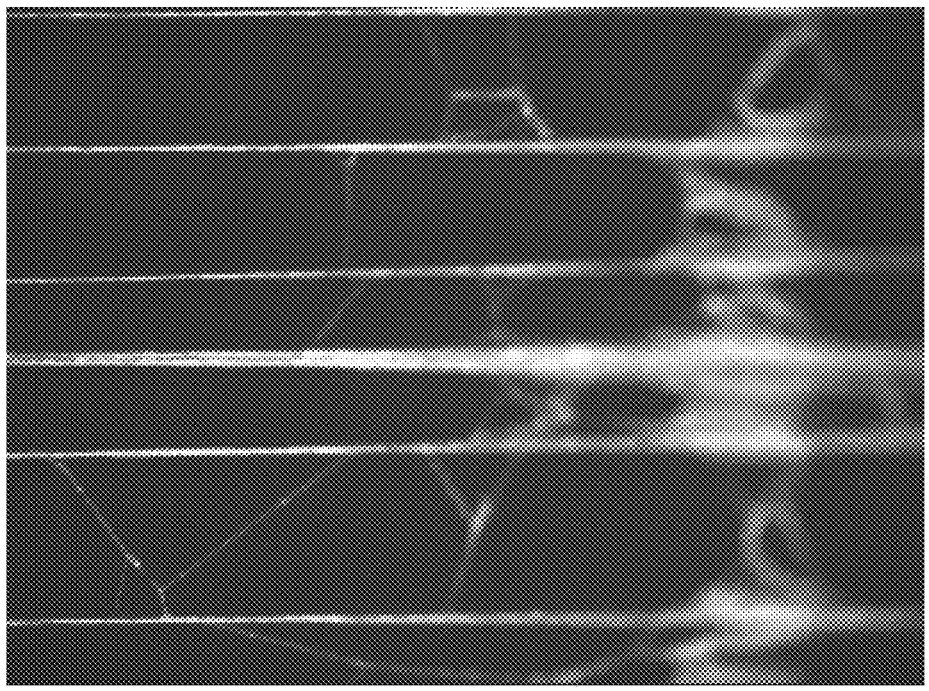
FIG. 6 is an optical microscope image of a part of the carbon nanotube film shown in FIG. 5.

Referring to FIG. 5 and FIG. 6, one embodiment of an electronic element 20 is provided. The electronic element 20 includes a carbon nanotube film 22, a number of first electrodes 14, and a number of second electrodes 16. The first electrodes 14 are separately located at a first same side of the carbon nanotube film 22. The second electrodes 16 are separately located at a second same side of the carbon nanotube film 22. In the carbon nanotube film 22, the second same side is opposite to the first same side. The first and second electrodes 14, 16 are electrically connected with the carbon nanotube film 22. The structure of the electronic element 20 is similar to the structure of the electronic element 10, except that the structure of the carbon nanotube film 22 is different from the structure of the carbon nanotube film 12, and the number of the first and second electrodes 14, 16.

The carbon nanotube film 22 includes the carbon nanotube linear units 122 and a number of second carbon nanotube groups 224. Each carbon nanotube group 224 includes a number of second carbon nanotubes extending along a direction which defines a second angle with the first direction X. The second angle can be greater than or equal to 0 degrees, and less than or equal to 45 degrees. In one embodiment, the second angle is greater than or equal to 0 degrees, and less than or equal to 30 degrees. In another embodiment, the carbon nanotubes in each carbon nanotube group 224 are substantially parallel to the first direction X and axes of the carbon nanotube linear units 122. As such, the carbon nanotubes of the carbon nanotube film 22 substantially extend along a same direction.

In addition, in the carbon nanotube film 22, there can be a few carbon nanotubes surrounding the carbon nanotube linear units 122 and the carbon nanotube groups 224 due to inherent limitations of the method for making the carbon nanotube structure.

The first electrodes 14 are electrically connected with the second electrodes 16 through the first conductive paths or the second conductive paths. The first electrodes 14 and the second electrodes 16 are located on two opposite ends of the carbon nanotube film 22. The numbers of the first electrodes 14, the second electrodes 16, the first conductive paths or the second conductive paths can be equal or unequal. In one embodiment, the first electrodes 14, the first conductive paths and the second electrodes 16 correspond to each other in a one to one manner. The first electrodes 14 are separately arranged in the second direction Y, and the second electrodes 16 are separately arranged in the second direction Y. The first electrodes 14 and the second electrodes 16 are located at two opposite ends of the carbon nanotube film 22 along the first direction X. In another embodiment, the first electrodes 14 and the second electrodes 16 can also be electrically connected with the second conductive paths. In one embodiment, the electronic element 10 includes a number of first electrodes 14 and a single second electrode 16. If the electronic element 10 includes a number of second electrodes, it can include a single first electrode 14.

Other structural characteristics of the electronic element 20 are substantially the same as structural characteristics of the electronic element 10.

When the electronic element 20 is in use, and a voltage is applied to all the first electrodes 14 and the second electrodes 16, electrical signals will pass through all the first conductive paths or the second conductive paths in the carbon nanotube film 22, therefore the first conductive paths or the second conductive paths are in work. The carbon nanotube film 22 is an isotropic and electrically conductive film, and can define continual conductive paths respectively in the first direction X and the second direction Y. When a voltage is applied to selected first electrodes 14 and selected second electrodes 16 corresponding to the selected first electrodes 14, strong electrical signals will pass through the first or second conductive paths corresponding to the selected first electrodes 14; electrical signals in the other first conductive paths or the other second conductive paths will be weak, even if no electrical signals pass through the other first or second conductive paths. Therefore, the electronic element 20 can select work regions, and can detect or sense the electrical signals in order, according to regions generated by the electrical signals.

Figure 7:
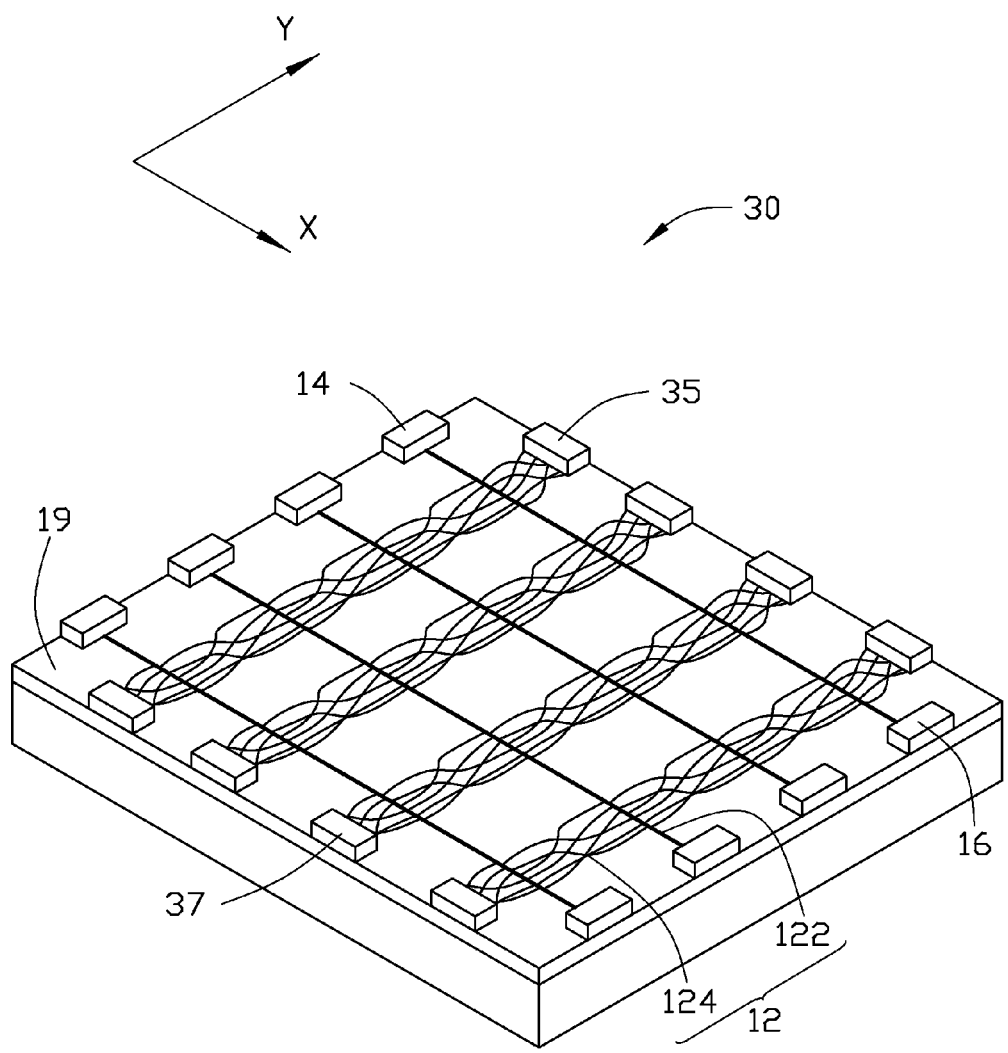
FIG. 7 is a schematic view of one embodiment of an electronic element.

Referring to FIG. 7, one embodiment of an electronic element 30 is provided. The electronic element 30 includes a carbon nanotube film 12, a number of first electrodes 14 and a number of second electrodes 16. The structure of the electronic element 30 is similar to that of the electronic element 20, except that the electronic element 30 includes the carbon nanotube film 12 rather than the carbon nanotube film 22, and the electronic element 30 further includes at least one third electrode 35 and at least one fourth electrode 37 electrically connected with the carbon nanotube film 12. The at least one third electrode 35 is opposite to the at least one fourth electrode 37. In the electronic element 30, the first electrodes 14, the at least one third electrode 35, a number of second electrodes 16, and the at least one fourth electrode 37 are located on four ends of the carbon nanotube film 12 in sequence. If the first electrodes 14 and the second electrodes 16 are in electrical contact with the first conductive paths, the at least one third electrode 35 and the at least one fourth electrode 37 will be electrically connected with the second conductive paths. In addition, if the first electrodes 14 and the second electrodes 16 are in electrical contact with the second conductive paths, the at least one third electrode 35 and the at least one fourth electrode 37 will be electrically connected with the first conductive paths.

In one embodiment, the electronic element 30 includes a number of first electrodes 14, a number of second electrodes 16, a number of third electrodes 35, and a number of fourth electrodes 37. The first electrodes 14 and the second electrodes 16 are respectively connected with the first conductive paths. The first electrodes 14, the second electrodes 16, and the first conductive paths correspond to each other in a one by one manner. The third electrodes 35 and the fourth electrodes 37 are insulated and separately located on the first direction X. The third electrodes 35 and the fourth electrodes 37 are electrically connected with the second conductive paths. The third electrodes 35, the second electrodes 37, and the second conductive paths correspond to each other in a one to one manner.

Other structural characteristics of the electronic element 30 are substantially the same as the structural characteristics of the electronic element 20.

The work theory of the electronic element 30 is similar to the work theory of the electronic element 20, except that the work regions of the electronic element 30 can be selected not only in the first direction X or the second direction Y, but also in both the first and second directions X, Y. The work theory of the electronic element 30 in the first direction or the second direction is the same as the work theory of the electronic element 20.

The numbers of the first electrodes, the second electrodes, the third electrodes, and the fourth electrodes in the electronic elements provided by the present disclosure are not limited, as long as the carbon nanotube films are in use when voltages are applied to the electrodes. The carbon nanotube films can be the carbon nanotube film 10 or 20.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. An electronic element, comprising:
    a carbon nanotube film comprising:
        a plurality of carbon nanotube linear units comprising a plurality of carbon nanotubes substantially oriented along a first direction, the plurality of carbon nanotube linear units spaced from each other and substantially extending along a first direction to form a plurality of first conductive paths, wherein the plurality of carbon nanotube linear units are substantially parallel to each other in a second direction, and each of the plurality of first conductive paths is linear;
        a plurality of carbon nanotube groups combined with the plurality of carbon nanotube linear units by van der Waals force on the second direction to form a plurality of second conductive paths, the second direction intercrossed with the first direction, wherein the plurality of carbon nanotube groups between adjacent carbon nanotube linear units are spaced from each other in the first direction; and
    at least one first electrode; and
    at least one second electrode, wherein the at least one first electrode and the at least one second electrode are electrically connected with the carbon nanotube film through the plurality of first conductive paths or the plurality of second conductive paths.

2. The electronic element of claim 1, wherein the plurality of carbon nanotube groups are arranged interlacedly in the second direction, and each of the plurality of second conductive paths is non-linear.

3. The electronic element of claim 1, wherein the plurality of carbon nanotube groups are arranged to form a plurality of columns in the second direction, and each of the plurality of second conductive paths is linear.

4. The electronic element of claim 1, wherein the carbon nanotube film is a free-standing structure.

5. The electronic element of claim 1, wherein each carbon nanotube linear unit comprises a plurality of first carbon nanotubes joined end-to-end by van der Waals force along the first direction.

6. The electronic element of claim 1, wherein an effective diameter of each carbon nanotube linear unit is greater than or equal to 0.1 micrometers, and less than or equal to 100 micrometers.

7. The electronic element of claim 1, wherein each carbon nanotube group comprises a plurality of second carbon nanotubes extending substantially along the first direction.

8. The electronic element of claim 1, wherein each carbon nanotube group comprises a plurality of second carbon nanotubes intercrossed with each other to form a net structure.

9. The electronic element of claim 1, wherein the plurality of carbon nanotube groups are alternated with the plurality of carbon nanotube linear units in the second direction.

10. The electronic element of claim 1, wherein the carbon nanotube film comprises a plurality of carbon nanotubes defining a plurality of apertures, and the plurality of carbon nanotubes are arranged to form the plurality of carbon nanotube linear units and the plurality of carbon nanotube groups.

11. The electronic element of claim 10, wherein a surface area ratio between the plurality of carbon nanotubes and the plurality of apertures is less than or equal to 1:19.

12. The electronic element of claim 10, wherein a surface area ratio between the plurality of carbon nanotubes and the plurality of apertures is less than or equal to 1:49.

13. The electronic element of claim 1, wherein the at least one first electrode comprises a plurality of first electrodes separately located at a first end of the carbon nanotube film.

14. The electronic element of claim 13, wherein the at least one second electrode comprises a plurality of second electrodes separately located at a second end of the carbon nanotube film opposite to the first end of the carbon nanotube film.

15. The electronic element of claim 13, wherein the at least one first electrode and the at least one second electrode are electrically connected with the plurality of first conductive paths, the electronic element further comprises at least one third electrode and at least one fourth electrode opposite and separate to the at least one third electrode, the at least one third electrode and the at least one fourth electrode are electrically connected with the plurality of second conductive paths.

16. The electronic element of claim 15, wherein the at least one third electrode comprises a plurality of third electrodes, and the at least one fourth electrode comprises a plurality of fourth electrodes corresponding to the plurality of third electrodes in a one to one manner.

17. The electronic element of claim 1, wherein the electronic element further comprises a substrate, and the carbon nanotube film is attached to the substrate by van der Waals force.

18. The electronic element of claim 17, further comprising an adhesive layer located between the carbon nanotube film and the substrate.

* * * * *